United States Patent
Arayashiki et al.

(10) Patent No.: US 9,040,953 B2
(45) Date of Patent: May 26, 2015

(54) STORAGE DEVICE

(71) Applicant: KABUSHIKI KAISHA TOSHIBA, Tokyo (JP)

(72) Inventors: Yusuke Arayashiki, Mie (JP); Hidenori Miyagawa, Mie (JP); Tomohito Kawashima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/194,787

(22) Filed: Mar. 2, 2014

(65) Prior Publication Data
US 2015/0076435 A1   Mar. 19, 2015

(30) Foreign Application Priority Data
Sep. 13, 2013   (JP) ................. 2013-191204

(51) Int. Cl.
H01L 47/00   (2006.01)
H01L 29/82   (2006.01)
H01L 43/00   (2006.01)
H01L 21/20   (2006.01)
G11C 11/00   (2006.01)
H01L 45/00   (2006.01)

(52) U.S. Cl.
CPC .......... *H01L 45/145* (2013.01); *H01L 45/1608* (2013.01); *H01L 45/1233* (2013.01)

(58) Field of Classification Search
CPC .............. H01L 45/145; H01L 45/1608; H01L 45/1233
USPC ........ 257/4, 421, E23.006; 365/148; 438/382
See application file for complete search history.

(56) References Cited

U.S. PATENT DOCUMENTS 8,835,896 B2 *   9/2014   Miyagawa et al. ............... 257/4

FOREIGN PATENT DOCUMENTS

JP   2013-069869 A   4/2013

* cited by examiner

*Primary Examiner* — David S Blum
(74) *Attorney, Agent, or Firm* — Patterson & Sheridan, LLP

(57) ABSTRACT

According to one embodiment, a storage device includes first electrodes, second electrodes, a resistance change layer provided between the first electrodes and the second electrodes, and ion metal particles that are formed in an island form between the first electrodes and the resistance change layer and that contain a metal movable inside the resistance change layer. The first electrodes and the second electrodes are formed of a material which is more unlikely to be ionized as compared to the metal, and the first electrodes are in contact with the resistance change layer in an area around the ion metal particles.

20 Claims, 16 Drawing Sheets

STORAGE DEVICE

CROSS-REFERENCE TO RELATED APPLICATION

This application is based upon and claims the benefit of priority from Japanese Patent Application No. 2013-191204, filed Sep. 13, 2013, the entire contents of which are incorporated herein by reference.

FIELD

Embodiments described herein relate generally to a storage device.

BACKGROUND

Recently, there has been proposed a storage device which includes a high-resistance film between a metal film and a counter electrode. Metal ions, contained in the metal film, diffuse within the high-resistance film so as to form or eliminate filaments that contain the metal ions, thereby changing the electric resistance of the high-resistance film into either a lower or a higher resistance state. However, conventional storage devices of this type are typically not able to reliably retain the stored data in the high or low resistant states.

DETAILED DESCRIPTION

Embodiments of the disclosure generally provide a storage device that is reliable and has excellent data retention characteristics.

In general, according to one embodiment, a storage device includes: a first electrode; a second electrode; a resistance change layer disposed between the first electrode and the second electrode; and a plurality of islands that are disposed between the first electrode and a surface of the resistance change layer, the plurality of islands each comprising a metal movable inside the resistance change layer. The first electrode and the second electrode are formed of a material which is less likely to be ionized as compared to the metal, and the first electrode is in contact with the resistance change layer at regions that are not covered by the plurality of islands.

Hereinafter, an embodiment of the present exemplary embodiment will be described with reference to the accompanying drawings.

Figure 1:
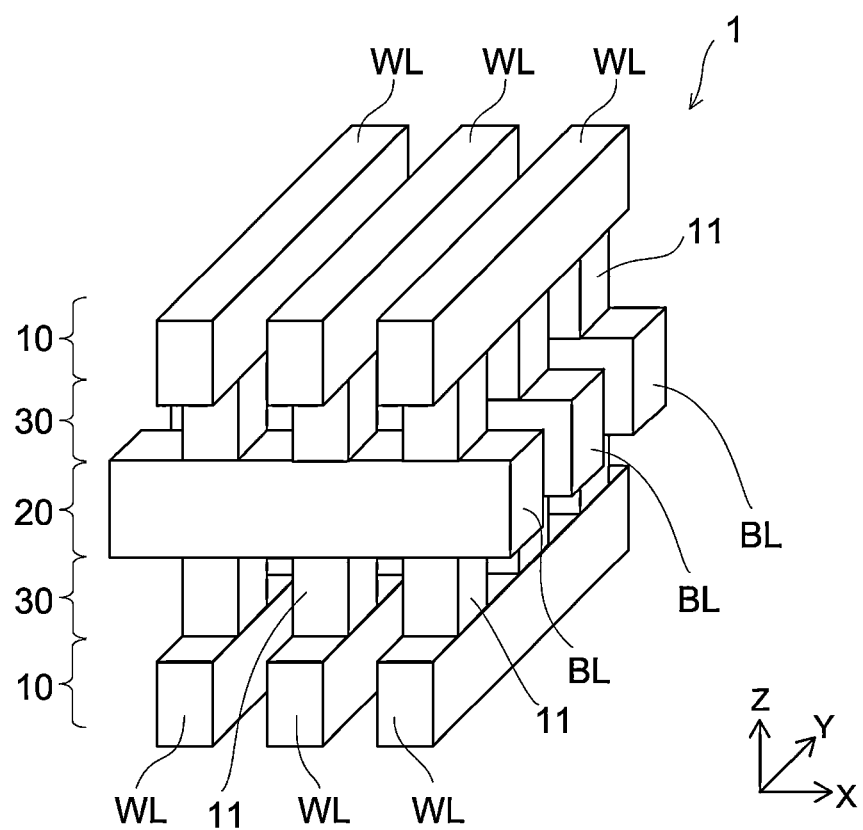
FIG. 1 is a perspective view illustrating a storage device according to an embodiment.
Figure 2:
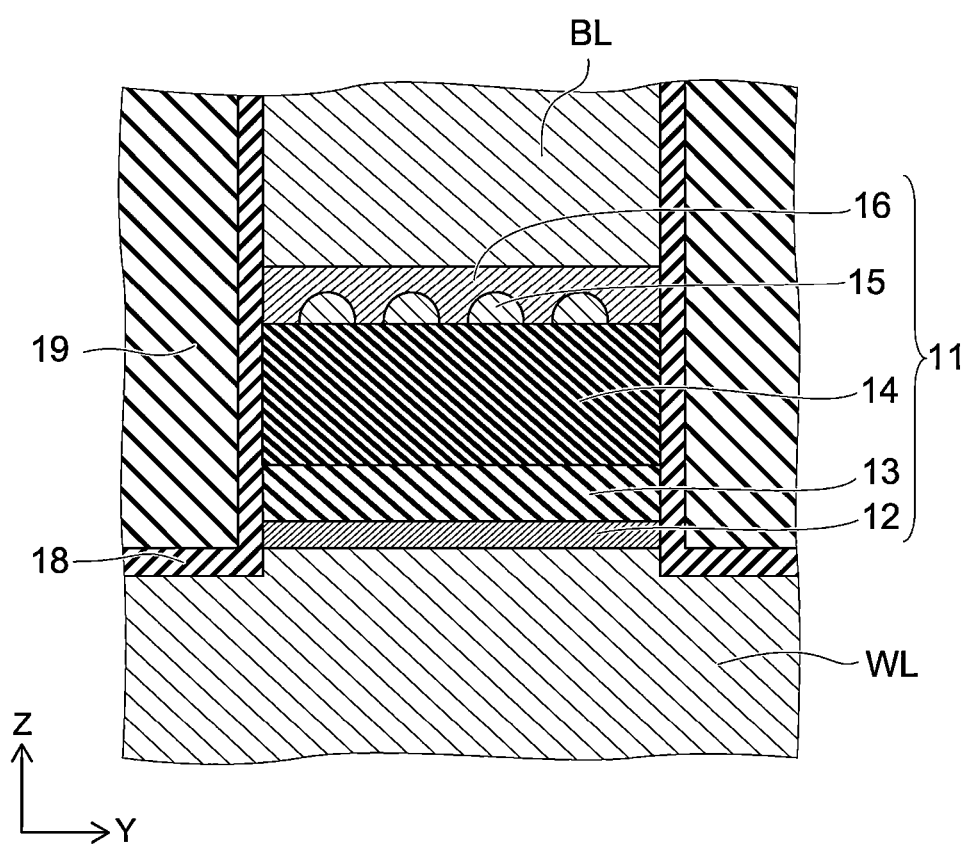
FIG. 2 is a cross-sectional view illustrating an area around a pillar of the storage device according to the embodiment.

FIG. 1 is a perspective view illustrating a storage device according to the present embodiment, and FIG. 2 is a cross-sectional view illustrating an area around a pillar of the storage device according to the present embodiment.

The storage device according to the present embodiment is a conduction bridge random access memory (CBRAM) which is a type of resistive RAM (ReRAM).

As shown in FIG. 1, a storage device 1 may include word line wiring layers 10 and a bit line wiring layer 20 that are alternately stacked along a vertical direction (a Z direction). Between each word line wiring layer 10 and bit line wiring layer 20, a memory cell layer 30 is provided. In FIG. 1, there are shown only two word line wiring layers 10 and one bit line wiring layer 20. However, this illustrated configuration is not intended to limit the scope of the invention(s) disclosed herein. More word line wiring layers 10 and bit line wiring layers 20 may be alternately stacked to form a larger device structure.

In each word line wiring layer 10, a plurality of word lines WL extend in at least one direction (e.g., a Y direction). In each bit line wiring layer 20, a plurality of bit lines BL extend in another direction (e.g., an X direction). The X direction, Y direction, and Z direction intersect with one another, for example, at right angles. In each memory cell layer 30, between each word line WL and each bit line BL, a pillar 11 is formed, which generally extends in the Z direction. That is, in each memory cell layer 30, a plurality of pillars 11 is arranged in a matrix along the X direction and the Y direction. Also, between the surfaces of the word lines WL, the bit lines BL, and the pillars 11, an inter-layer insulating film 19 (see FIG. 2) is disposed. However, in FIG. 1, the inter-layer insulating film 19 is not shown for convenience of illustration.

As shown in FIG. 2, in each pillar 11, a barrier metal layer 12, a lower electrode layer (current limiting layer) 13, a resistance change layer 14, and a barrier metal layer 16 are stacked sequentially from a corresponding word line WL toward a corresponding bit line BL. The bit line BL and the barrier metal layer 16 form an electrode within the formed pillar 11. Further, between the resistance change layer 14 and the barrier metal layer 16, one or a plurality of ion metal particles 15 are provided. Each ion metal particle 15 is an island-shaped component whose diameter is, for example, about several nanometers, and is in contact with the resistance change layer 14 and the barrier metal layer 16. The barrier metal layer 16 is also in contact with the resistance change layer 14 in an area around the ion metal particles 15. In other words, the barrier metal layer 16 is in contact with the resistance change layer 14 in areas where the ion metal particles 15 do not exist. Also, in one example, on the side surfaces of the pillar 11, a liner film 18 is provided, and around the liner film 18, the inter-layer insulating film 19 is provided.

Also, the pillar 11 shown in FIG. 2 is disposed on a word line WL and a bit line BL is disposed on the pillar 11. Therefore, in some configurations, the ion metal particles 15 are disposed on the resistance change layer 14. However, in a case of a pillar 11 is disposed on a bit line BL and a word line WL is disposed on the pillar 11, the ion metal particles 15 are disposed below a resistance change layer 14. However, in some embodiments, it can be said that the ion metal particles are in contact with a surface of the resistance change layer 14, which is positioned adjacent to a bit line BL. That is, inside each pillar 11, the ion metal particles 15 are disposed relatively on the bit line (BL) side, and the resistance change layer 14 is disposed relatively on the word line (WL) side of the pillar 11. Each word line WL may function as a counter electrode.

The word lines WL and the bit lines BL may be formed of a metal or metal alloy, such as, for example, tungsten (W). The barrier metal layers 12 and 16 may be formed of a metal or metal alloy, such as, for example, titanium (Ti), titanium nitride (TiN), tantalum nitride (TaN) or tungsten nitride (WN). The liner film 18 may be formed from a dielectric film, for example, silicon nitride ($Si_3N_4$), and the inter-layer insulating film 19 is formed from a dielectric film, for example, silicon oxide ($SiO_2$).

The ion metal particles 15 are composed of a metal capable of repeatedly moving inside the resistance change layer 14. The metal provided from the ion metal particle 15 is able to form a metal filament in the resistance change layer 14 when a bias is applied between a word line WL and a bit line BL. The ion metal particles 15 may be formed from a metal, such as, for example, silver (Ag). Also, the ion metal particles 15 may be formed from other metals, such as aluminum (Al), copper (Cu), nickel (Ni), or compounds thereof.

The resistance change layer 14 is a layer in which the filaments are formed due to the metal moving from the ion metal particles 15 and aligning itself within the resistance change layer 14. The resistance change layer 14 is formed of a material in which the metal forming the ion metal particles 15 can move (e.g., diffuse) and which has a resistivity higher than that of the metal, or has an insulation property. The resistance change layer 14 may be formed of, for example, amorphous silicon (Si), polysilicon, silicon oxide ($SiO_2$), silicon nitride (SiN), hafnium oxide ($HfO_2$), zirconium oxide ($ZrO_2$), or the like. Also, the resistance change layer 14 may be formed so that it has a monolayer thickness, or may include a laminated film including two or more layers.

The lower electrode layer 13 is formed of a material in which the metal forming the above described ion metal particles 15 can move. The lower electrode layer 13 is a current limiting layer for preventing a short circuit defect due to the generation or application of a large current when the memory cells formed in the pillar 11 perform a "set" operation. The resistance value that is required for the lower electrode layer 13 is determined according to design of the storage device 1, and is about 1 MΩ to 1 GΩ. The lower electrode layer 13 may be formed of, for example, a material having electric resistivity higher than that of the metal forming the ion metal particles 15. The lower electrode layer 13 may be, for example, a layer which is formed of amorphous silicon or polysilicon, and has a thickness adjusted to form a desired resistance value, or may be a layer which is formed of tantalum aluminum nitride (TaAlN) or tantalum silicon nitride (TaSiN) and has a thickness or composition adjusted to achieve a desired resistance value. Also, according to the design of the storage device 1, the lower electrode layer 13 may be omitted. In one example, the lower electrode layer 13 includes, for example, polysilicon.

Subsequently, a method of manufacturing the storage device according to one embodiment will be described.

FIGS. 3 to 11 are perspective cross-sectional views illustrating the method of manufacturing the storage device according to one embodiment.

Figure 3:
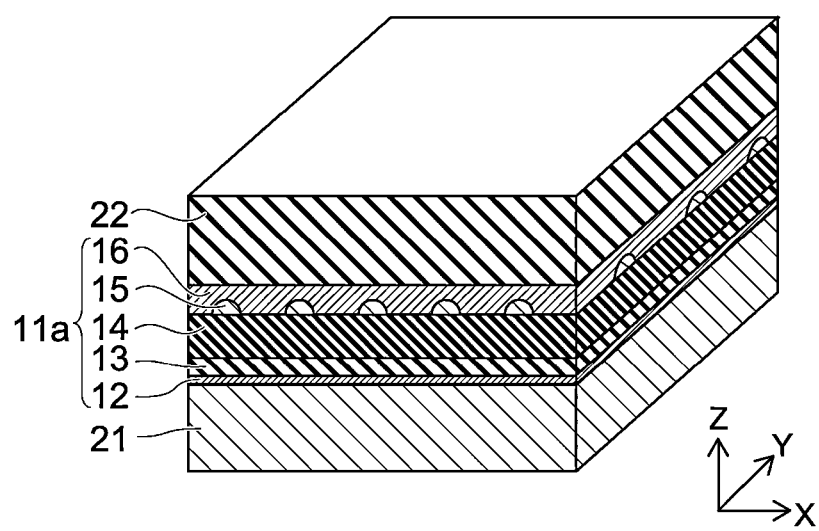
FIG. 3 is a perspective cross-sectional view illustrating a method of manufacturing the storage device according to the embodiment.

First, as shown in FIG. 3, on a silicon substrate (not shown), an inter-layer insulating film (not shown) is formed, and thereon, for example, tungsten is deposited so as to form a conductive film 21 over the entire surface of the substrate. Subsequently, on the entire surface of the conductive film 21, a barrier metal layer 12, a lower electrode layer 13, and a resistance change layer 14 are sequentially formed.

Next, the metal used to form the ion metal particles 15, for example, silver is deposited. In this way, island-shaped ion metal particles 15 are formed on the resistance change layer 14. The sizes of the ion metal particles 15 are adjusted according to the widths of pillars 11 such that one or several ion metal particles 15 are included in each pillar 11. In this case, the deposition amount of silver is set to, for example, 5 nm or less, or 3 nm or less, or 1 nm or less. The term "deposition amount" means an amount necessary to form a flat continuous film having a certain thickness, if it is assumed that the deposited material forms a continuous film layer. For example, a deposition amount of 5 nm means an amount of a deposited material necessary to form a flat continuous film having a thickness of 5 nm.

The method of depositing the material used to form the ion metal particles 15, such as silver, may be completed by a vapor deposition process such as a sputtering method and chemical vapor deposition (CVD) method), or may be a coating method (e.g., a spin coat process. In a case of a vapor deposition process, may include a means for controlling temperature, a means for controlling atmosphere (e.g., processing environment), or a means for modifying the base material so as to make the base material hydrophobic or hydrophilic to cause the agglomeration of the deposited material used to form the ion metal particles 15 (e.g., silver), whereby the island-shaped ion metal particles 15 are formed. Also, in a case of a coating method, for example, a solution containing a material, such as silver, in a colloidal state is applied and dried, whereby the island-shaped ion metal particles 15 are formed. However, the method of forming the ion metal particles 15 is not limited to those methods.

Next, on the resistance change layer 14, a conductive material is deposited to cover the ion metal particles 15, whereby a barrier metal layer 16 is formed. The barrier metal layer 16 is in contact with the ion metal particles 15 and is also in contact with the resistance change layer 14 in the area around the ion metal particles 15. In this way, a laminated film 11a is formed. Next, on the laminated film 11a, a hard mask 22 is formed. The hard mask 22 is formed of, for example, silicon oxide or silicon nitride.

Figure 4:
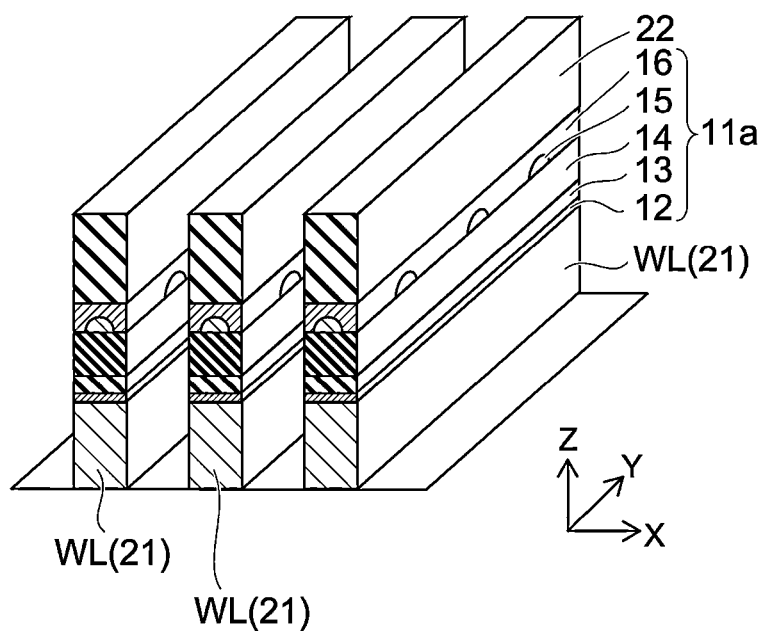
FIG. 4 is another perspective cross-sectional view illustrating the method of manufacturing the storage device according to the embodiment.

Subsequently, as shown in FIG. 4, the hard mask 22 is patterned in a line-and-space form extending in the Y direction by a resist coating process, a lithography process, and development. Next, anisotropic etching such as reactive ion etching (RIE) is performed on the hard mask 22, which is used as a mask, whereby the laminated film 11a and the conductive film 21 are patterned. In this way, the laminated film 11a is processed in a line form extending in the Y direction. Also, the conductive film 21 is etched to form a line extending in the Y direction, so as to become a plurality of word lines WL.

Figure 5:
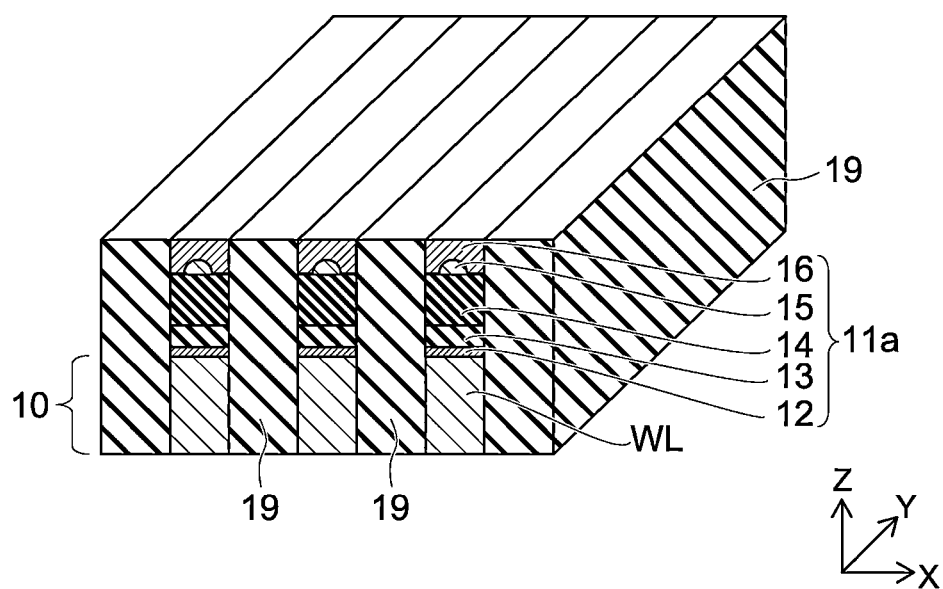
FIG. 5 is another perspective cross-sectional view illustrating the method of manufacturing the storage device according to the embodiment.

Next, as shown in FIG. 5, over the entire surface, liner film 18 (see FIG. 2) is formed, and then the inter-layer insulating film 19 is deposited on the liner film 18, wherein the inter-layer insulating film 19 may include a silicon oxide material. Subsequently, a chemical mechanical polishing (CMP) process is performed on the structure, until the barrier metal layer 16, which is used as a polishing stop layer, is reached. In this way, the hard mask 22 is removed, and the inter-layer insulating film 19 is embedded between the laminated film 11a, which remains in a line form. As a result, a word line wiring layer 10 in which word lines WL and the inter-layer insulating film 19 are alternately arranged, and a structure in which the line-shaped laminated film 11a and the inter-layer insulating film 19 are alternately arranged are formed.

Figure 6:
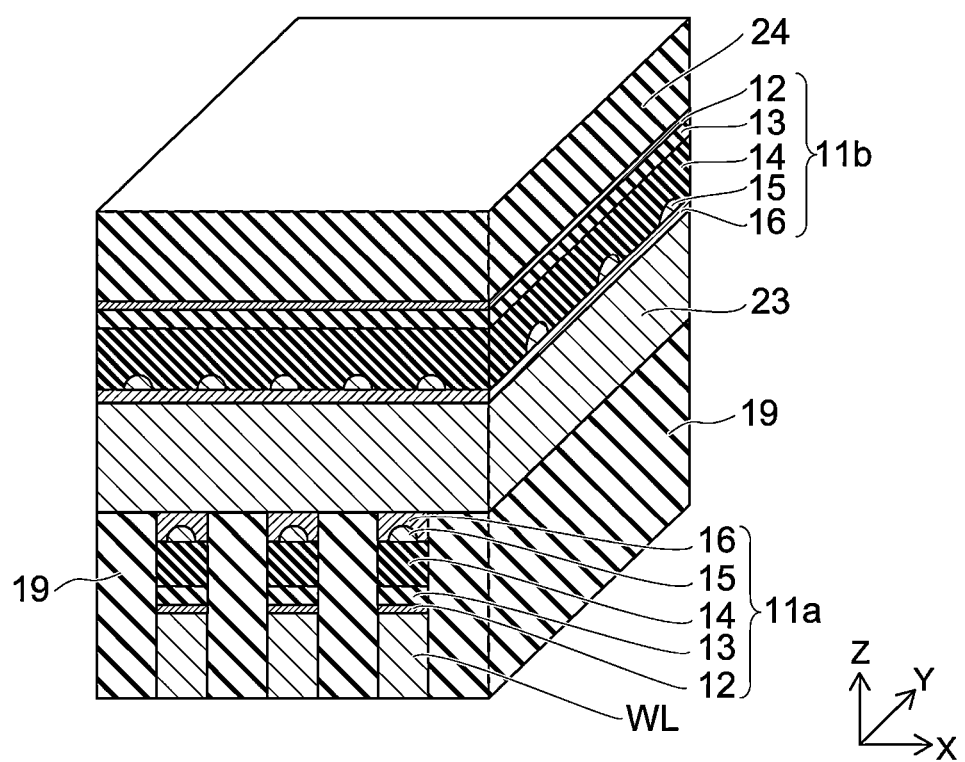
FIG. 6 is another perspective cross-sectional view illustrating the method of manufacturing the storage device according to the embodiment.

Next, as shown in FIG. 6, on the entire surface, for example, a metal containing layer (e.g., tungsten containing layer) is deposited so as to form a conductive film 23. Subsequently, a barrier metal layer 16 is formed. Next, on the barrier metal layer 16, ion metal particles 15 are formed. The method of forming the ion metal particles 15 may be the same as the above described method. Next, on the barrier metal layer 16, a resistance change layer 14 is formed to cover the ion metal particles 15 and a portion of the barrier metal layer 16. The resistance change layer 14 is in contact with the ion metal particles 15, and is also in contact with the barrier metal layer 16 in an area around the ion metal particles 15. Next, a lower electrode layer 13 and a barrier metal layer 12 are sequentially formed in a stacked orientation. In this way, a laminated film 11b is formed. Subsequently, a hard mask 24 is formed.

Figure 7:
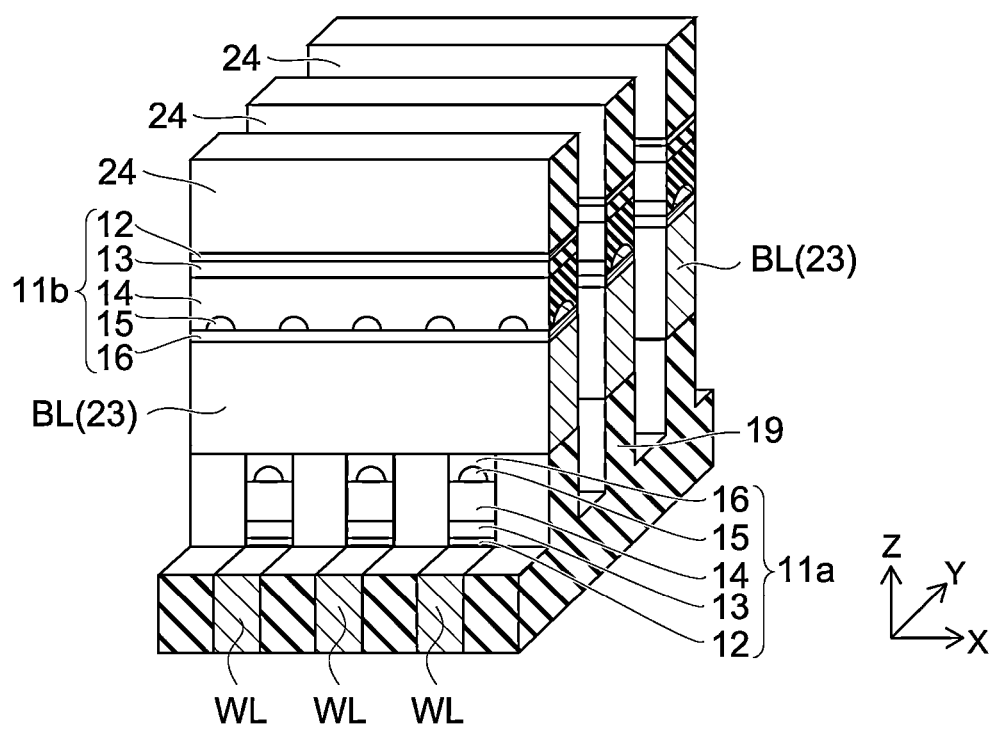
FIG. 7 is another perspective cross-sectional view illustrating the method of manufacturing the storage device according to the embodiment.

Next, as shown in FIG. 7, the hard mask 24 is patterned in a line-and-space form extending in the X direction by a resist coating process, a lithography process, and development. Subsequently, anisotropic etching process, such as RIE is performed using the hard mask 24 as a mask, whereby the laminated film 11b, the conductive film 23, and the laminated film 11a are patterned.

In this way, the laminated film 11b is processed in a line form extending in the X direction. Further, the conductive film 23 is processed in a line form extending in the X direction, so as to become a plurality of bit lines BL. Furthermore, the laminated film 11a having been already processed in the line form extending in the Y direction is now divided in the X direction. In this way, the laminated film 11a is divided along both of the X direction and the Y direction, thereby forming a plurality of pillars 11 in a matrix.

Figure 8:
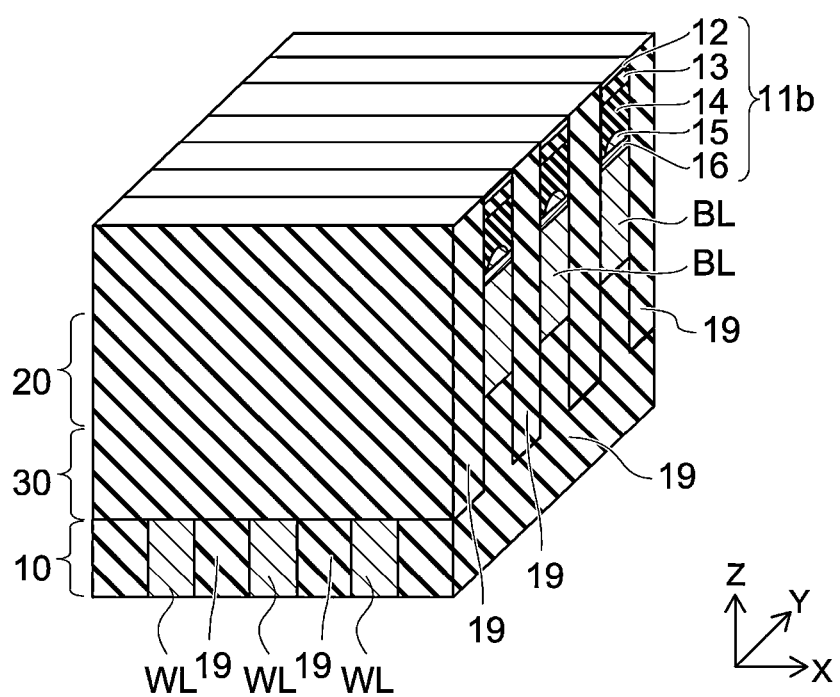
FIG. 8 is another perspective cross-sectional view illustrating the method of manufacturing the storage device according to the embodiment.

Next, as shown in FIG. 8, on the entire surface, a liner film 18 (see FIG. 2) is formed, and then the inter-layer insulating film 19 is deposited on the liner film 18, wherein the inter-layer insulating film. 19 may include a silicon oxide material. Subsequently, a CMP process is performed with the barrier metal layer 12 of the laminated film 11b being used as a polishing stop layer. In this way, the hard mask 24 is removed, and the inter-layer insulating film 19 is embedded between the pillars 11 and the laminated film 11b remains in the line form. As a result, a memory cell layer 30 (FIG. 8) in which the pillars 11 are arranged in a matrix inside the inter-layer insulating film 19, a bit line wiring layer 20 in which the bit lines BL and the inter-layer insulating film 19 are alternately arranged, and a structure in which the laminated film 11b layer, which is in the line form, and the inter-layer insulating film 19 are alternately arranged are formed.

Figure 9:
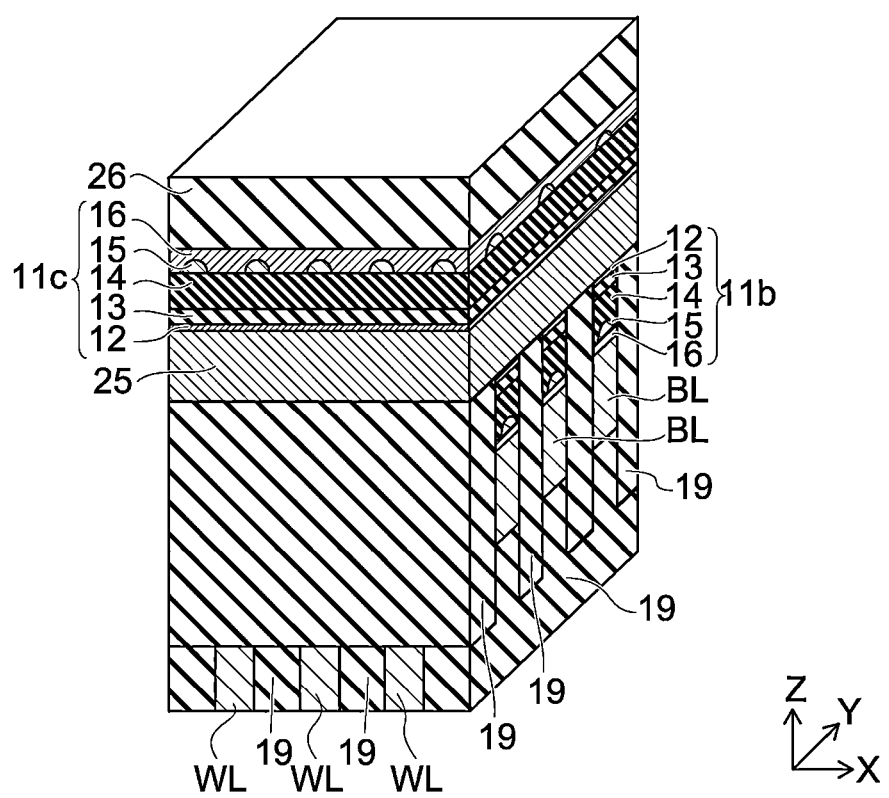
FIG. 9 is another perspective cross-sectional view illustrating the method of manufacturing the storage device according to the embodiment.

Subsequently, as shown in FIG. 9, on the entire surface, for example, a metal containing layer (e.g., tungsten containing layer) is deposited so as to form a conductive film 25. Next, a barrier metal layer 12, a lower electrode layer 13, and a resistance change layer 14 are sequentially stacked. Subsequently, by using the same methods as described above, the resistance change layer 14 and ion metal particles 15 are formed, and thereon, a barrier metal layer 16 is formed. In this way, a laminated film 11c is formed. Next, a hard mask 26 is formed over the laminated film 11c.

Figure 10:
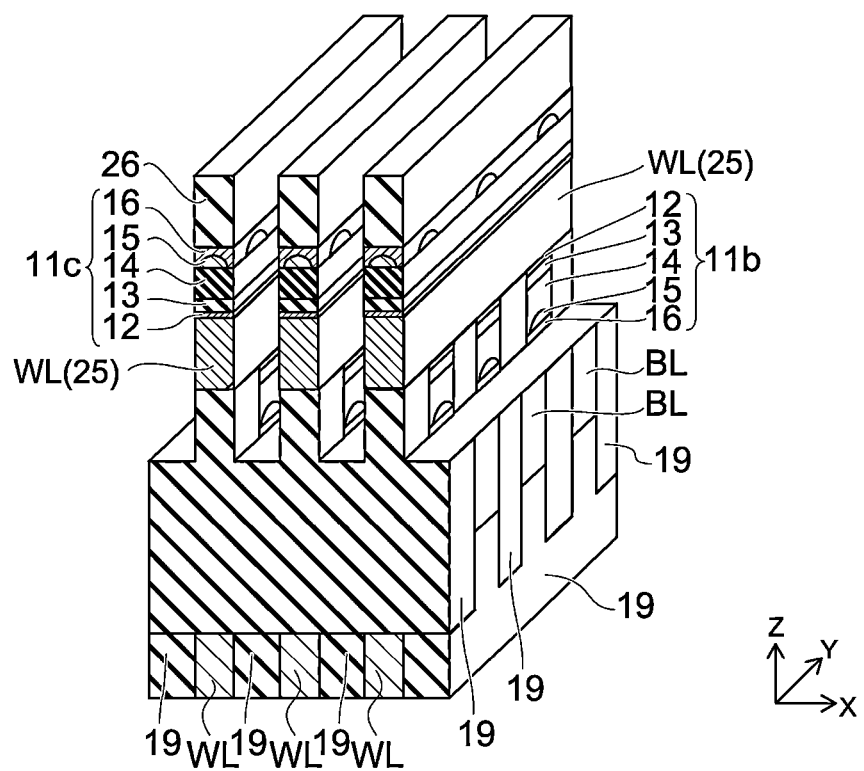
FIG. 10 is another perspective cross-sectional view illustrating the method of manufacturing the storage device according to the embodiment.

Next, as shown in FIG. 10, the hard mask 26 is patterned in a line-and-space form extending in the Y direction by a resist coating process, a lithography process, and development. Subsequently, an anisotropic etch process, such as an RIE process is performed on the hard mask 26, which is used as a mask, whereby the laminated film 11c, the conductive film 25, and the laminated film 11b are patterned.

In this way, the laminated film 11c is formed in a line shape that extends in the Y direction. Further, the conductive film 25 is also formed in a line shape that extends in the Y direction, so as to become a plurality of word lines WL. Furthermore, the laminated film 11b having been already formed in a line shape that extends in the X direction is now divided in the Y direction. In this way, the laminated film 11b is divided along both the X direction and the Y direction, thereby forming a plurality of pillars 11b in a matrix pattern.

Figure 11:
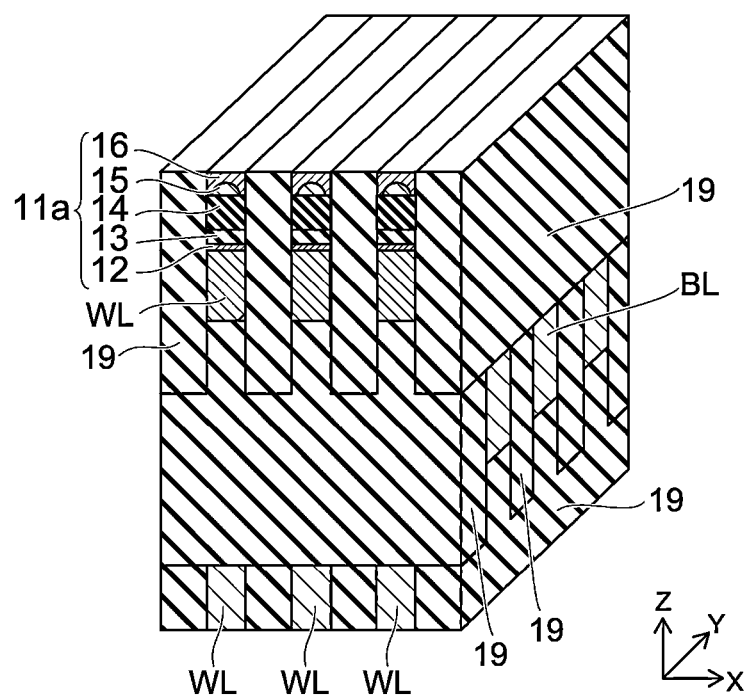
FIG. 11 is another perspective cross-sectional view illustrating the method of manufacturing the storage device according to the embodiment.

Next, as shown in FIG. 11, on the entire surface, a liner film 18 (see FIG. 2) is formed, and then the inter-layer insulating film 19 is deposited on the liner film 18, wherein the inter-layer insulating film 19 may include a silicon oxide material. Subsequently, a CMP process is performed on the uppermost barrier metal layer 16, which is used as a polishing stop layer. In this way, the hard mask 26 is removed, and the inter-layer insulating film 19 is embedded between the pillars 11b and the laminated film 11c, which is formed in a line shape.

Thereafter, similarly, a process of forming a conductive film and a laminated film on the entire surface of the previously described laminated film layers is performed. The added layers may include a resistance change layer 14, a ion metal particles 15, and a barrier metal layer 16, which is then processed to form a line that extends in one direction. Next, an upper laminated film, a conductive film, and a lower laminated film is then processed to form a line that extends in another direction is then repeated. In this way, it is possible to repeatedly form word lines WL extending in the Y direction, pillars 11, bit lines BL extending in the X direction, and pillars 11, which are used to form the storage device 1.

Subsequently, the operation and effects of the storage device according to the present embodiment will be described.

First, a basic memory storage operation will be described.

Referring to FIG. 2, if a voltage (hereinafter, referred to as a positive voltage) is applied to a word line WL and bit line BL across a pillar 11, such that the word line WL is the negative electrode and the bit line BL is the positive electrode, some of metal atoms (e.g., silver atoms) contained in the ion metal particles 15 are ionized so as to become positive ions. These positive ions move toward the word line WL, which is a negative electrode (cathode), and thus enter the resistance change layer 14. Thereafter, while inside the resistance change layer 14, the positive ions are combined with electrons supplied from the word line WL, thereby forming a non-ionized silver atom in the resistance change layer 14. Therefore, for example, inside the resistance change layer 14, filaments F (see FIG. 12A) are formed mainly of silver. The bias to the word line WL and bit line BL can thus be applied so that the filament passes through the resistance change layer 14. As a result, the filaments F become current paths through the resistance change layer 14, and the pillar 11 is said to be placed in a low-resistance state. This operation is referred to as a "set" operation.

Meanwhile, if a voltage (hereinafter, referred to as a negative voltage) is applied to a word line WL and bit line BL across a pillar 11, such that the word line WL is the positive electrode and the bit line BL is the negative electrode, metal atoms (e.g., silver atoms) in the previously formed filaments F are ionized so as to form positive ions, which then move (e.g., diffuse) towards the negatively biased bit line BL. Thereafter, the positive ions recombine with electrons, which were supplied from the bit line BL, at the surface of ion metal particles 15, thereby returning the positive ions to metal atoms (e.g., silver atoms). Therefore, at least a portion of the filaments F formed inside the resistance change layer 14 are eliminated, whereby the pillar 11 is said to be placed in a high-resistance state. This operation is referred to as a "reset" operation. Therefore, the storage device 1 stores data in association with the low-resistance state or the high-resistance state of each pillar 11.

Also, immediately after the set operation, that is, immediately after a positive voltage being applied to the pillar 11 is interrupted, some of the filaments F formed inside the resistance change layer 14 will decompose. Therefore, even if a reverse voltage (e.g., negative voltage) is applied to the pillar 11 being in that state, current paths through the filaments F are not formed, and thus current does not flow. Meanwhile, if a positive voltage lower than a set voltage necessary to complete the set operation is applied as a read voltage to the pillar 11, the filaments F that were decomposed are reformed, and thus current flows at an expected or desired value. Therefore, it is possible to detect that the pillar 11 is in the low-resistance state. As described above, an element including the ion metal particles 15 and the resistance change layer 14 has a rectifying function.

Subsequently, the effects of formation of the ion metal particles 15 in the island form will be described.

Figure 12A:
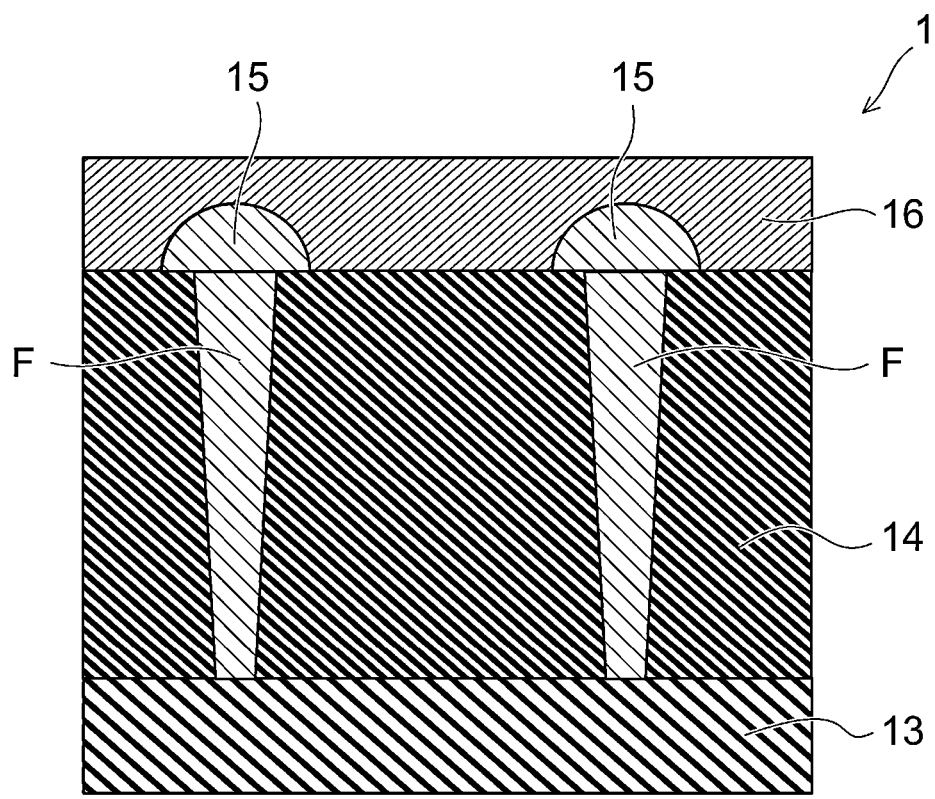
FIG. 12A is a schematic cross-sectional view illustrating the operation of the storage device according to the embodiment.
Figure 12B:
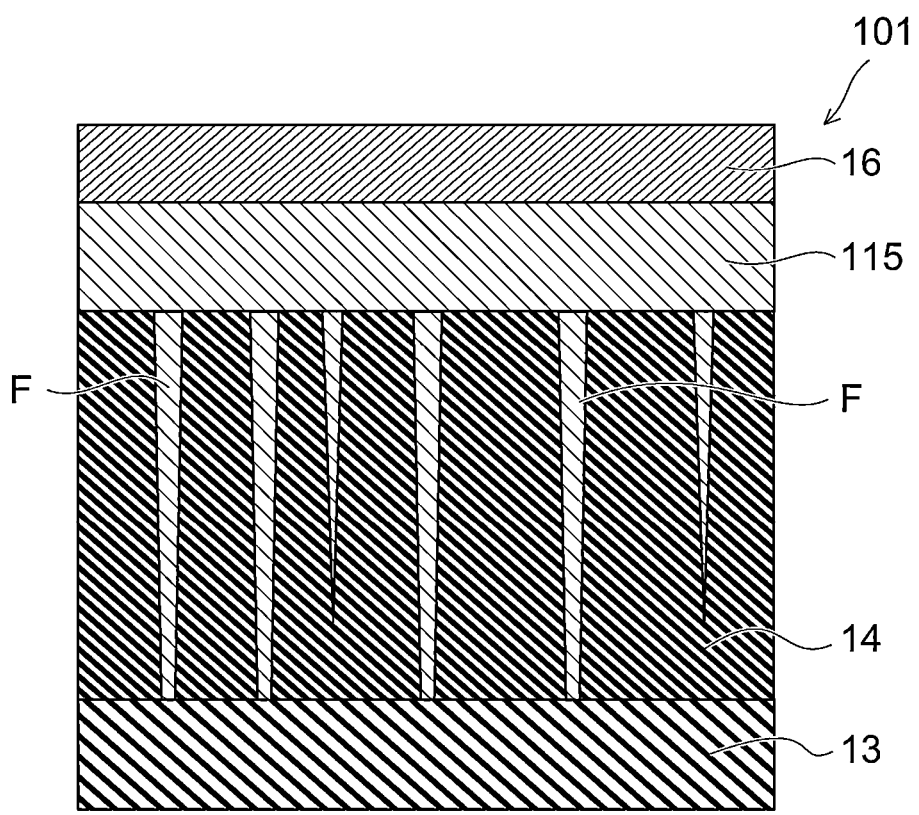
FIG. 12B is a schematic cross-sectional view illustrating the operation of a storage device according to a comparative example.

FIG. 12A is a schematic cross-sectional view illustrating the operation of the storage device according to the present embodiment, and FIG. 12B is a schematic cross-sectional view illustrating the operation of a storage device according to a comparative example.

It is believed that if the ion metal particles 15 are formed in the island form as shown in FIG. 12A, as compared to a case where a flat ion metal layer is formed, areas capable of being ionized such that they are cores for filament growth, when a voltage is applied, are limited. That is, as compared to the case of the flat ion metal layer, the efficiency of generation of cores that are starting points for growth of filaments is reduced. Therefore, in the case of forming the ion metal in the island form, a probability in which a plurality of filaments will grow at the same time is reduced, and thus the bias voltage is concentrated on a few of the formed filaments, such that the formed filaments are thicker, stronger and more robust. Even if the voltage is turned off, the formed filaments that are thick and strong are likely to hold their filament shape inside the resistance change layers 14, and thus it is easy to maintain the low-resistance state. Therefore, the storage device 1 according to the one embodiment will have an excellent data retention characteristic.

Also, in the storage device 1 according to the present embodiment, since the barrier metal layers 16 are in direct contact with the resistance change layers 14, the adhesiveness between the resistance change layers 14 and the barrier metal layers 16 is excellent. Therefore, in a process of manufacturing the storage device 1, it becomes difficult for the interfaces between the resistance change layers 14 and the ion metal particles 15 to be a starting point for film peeling, for example, in a process of stacking films in a plane form. Also, by use of one or more of the embodiments described herein, it is more difficult for pillar-shaped or line-shaped patterns to collapse.

Meanwhile, as shown in FIG. 12B, in a storage device 101 according to a comparative example, a layer-shaped ion metal layer 115 is provided between a resistance change layer 14 and a barrier metal layer 16. The ion metal layer 115 is formed of silver. Since the ion metal layer 115 is a continuous film, the barrier metal layer 16 is not in contact with the resistance change layer 14.

In the storage device 101, since filaments F can be formed from any portion of the ion metal layer 115, the probability for the generation of cores on which filaments form is high, and as a result, the number of filaments F that are formed increases. Since the number of filaments that grow at the same time during the "set" operation increases as compared to the case where filaments are formed from an island type formation, the voltage applied to each filament is distributed, and thus each of the formed filaments F are thin and weak. As a result, after applying the set voltage, if an amount of time elapses, the filaments F are likely decompose and/or be eliminated, and thus it is difficult for the device to remain in the low-resistance state. Therefore, the data retention characteristic of the storage device 101 is low.

Also, in the storage device 101 according to the comparative example, the barrier metal layer 16 is not in direct contact with the resistance change layer 14. In general, metals used to form the ion metal layer 115 have a low adhesive properties with the material forming the resistance change layer 14. Thus, peeling is likely to occur at the interface between the resistance change layer 14 and the ion metal layer 115. Therefore, in the device 101, the adhesiveness between the resistance change layer 14 and the barrier metal layer 16 is low. For this reason, in a process of manufacturing the storage device 101, the interface between the resistance change layer 14 and the ion metal layer 115 is likely to be the starting point for film peeling. Peeling can especially be a problem where, for example, the process includes stacking films in a plane form. Also, even in a processed case, pillar-shaped or line-shaped patterns are likely to collapse.

Subsequently, experiment examples showing the effects of the present embodiment will be described.

First, a first experiment example will be described.

Figure 13:
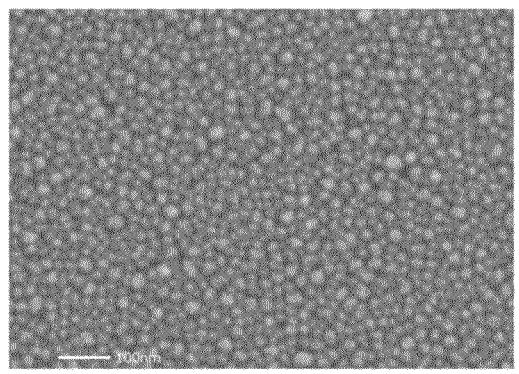
FIG. 13 is a scanning electron microscope (SEM) photograph of the surface of a sample having silver formed in an island form.

FIG. 13 is an SEM photograph of a surface of a sample having a silver layer formed in an island structure formed thereon.

As shown in FIG. 13, in this example, silver was sputtered on the surface of the substrate, which caused the silver to agglomerate on the surface of the substrate to form silver in an island form whose diameter was in the several nanometers to several tens nanometers in size. If this technology is used, it is possible to form ion metal particles 15 having predetermined sizes inside the pillars 11 as shown in FIG. 2.

Subsequently, a second experiment example will be described.

In this example, four samples having the structures shown in FIGS. 12A and 12B were manufactured. The amount of silver that was deposited on each resistance change layer was set to a different value. Samples having silver deposited to form islands, and samples having silver deposited to form a continuous layer, according to the comparative example, were manufactured. Next, a predetermined voltage was applied to perform a set operation, such that pillars became a low-resistance state. Thereafter, a voltage was applied until a predetermined current value was measured after a predetermined time, and the measured voltage value was defined as the set voltage. Then the change in the set voltage with time was examined and plotted in FIG. 14. It is believed that a larger increase in the set voltage over time shows that the filaments formed inside resistance change layers have decomposed more than a sample that had a smaller increase in the set voltage over time. Samples that have a lower increase in set voltage over time will have a greater data retention characteristic over time. The required voltage to perform "set" and "reset" is 1 to 5V (preferably 1 to 3V).

Figure 14:
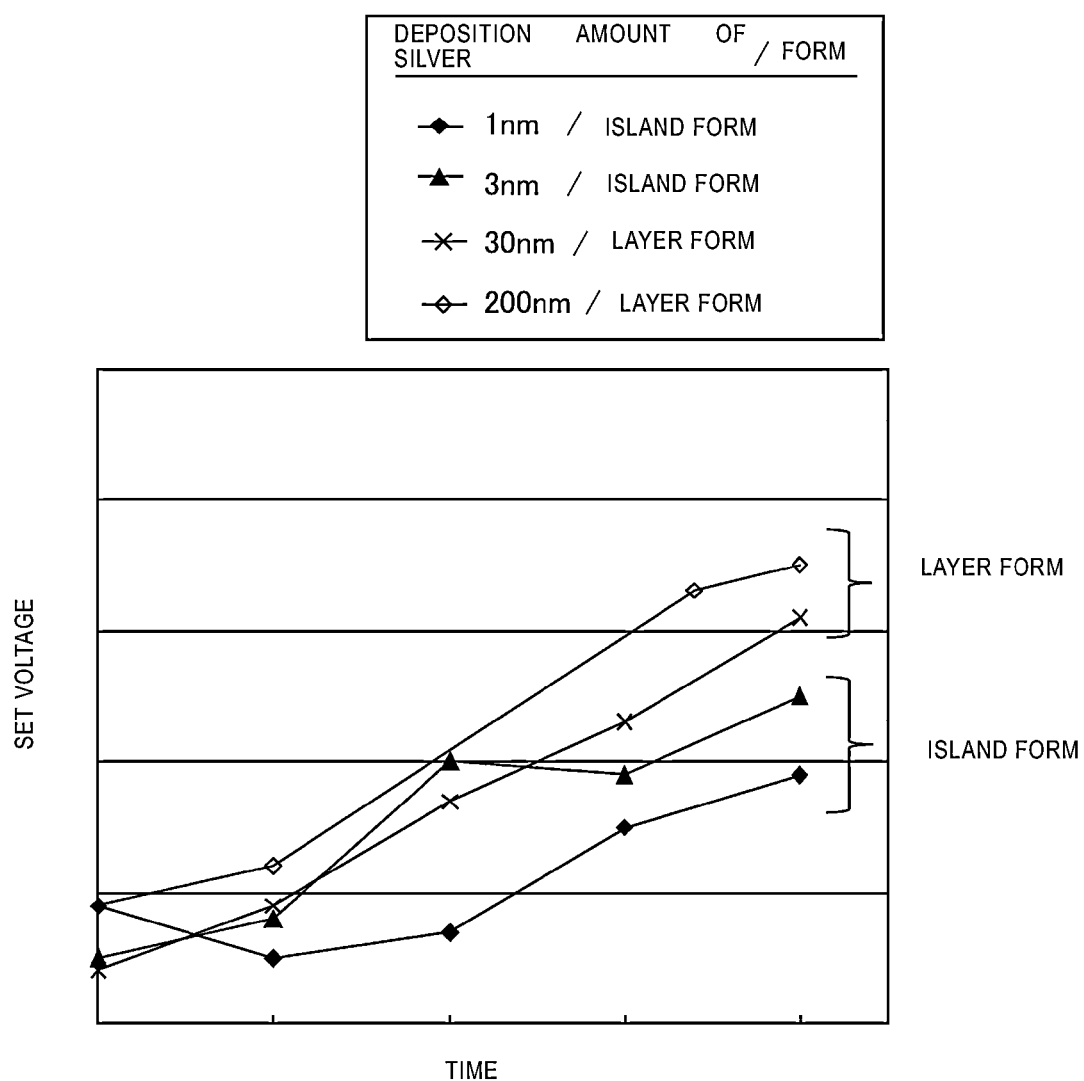
FIG. 14 is a graph chart illustrating change of a set voltage with time and showing time on the horizontal axis and the set voltage on the vertical axis.

FIG. 14 is a plot of the change of set voltage with time, where time is plotted on the horizontal axis and the set voltage plotted on the vertical axis.

As shown in FIG. 14, in the cases of the samples having an island form, the increases in the set voltages was less than the samples having a layer form (e.g., comparative example), and their data retention characteristics was excellent.

Subsequently, a third example will be described.

In this example, a plurality of samples were formed in which silver was deposited on a base with a pattern having a step, and a barrier metal layer of titanium nitride (TiN) was formed thereon. In one example, the deposition amount of silver was set to 3 nm on a sample, which created an island formation on the sample. Meanwhile, in another example, the deposition amount of silver was set to 30 nm, which created a layer on the surface of the sample. Thereafter, adhesion of each ion metal layer to the corresponding base was evaluated by a modified-edge lift-off test (m-ELT) method.

Figure 15:
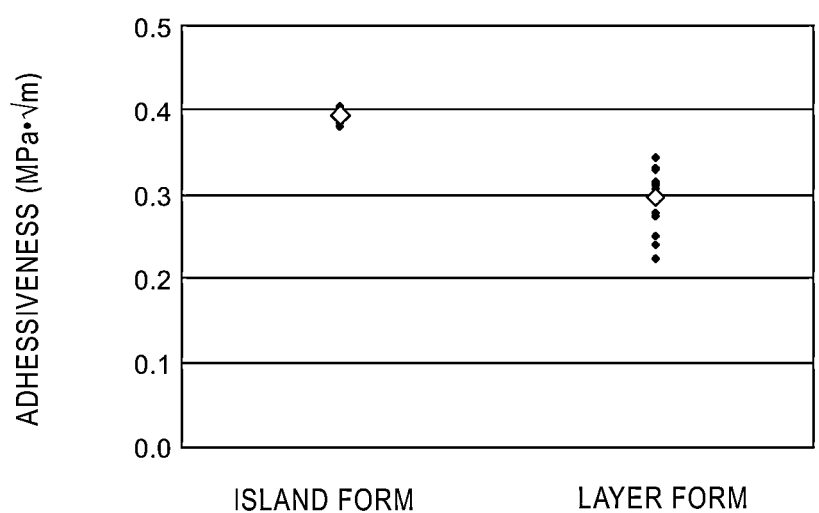
FIG. 15 is a graph chart illustrating the influence of the form of silver on adhesiveness and showing samples on the horizontal axis and adhesion on the vertical axis.

FIG. 15 is a chart illustrating the influence of silver on the adhesiveness of the different silver layer and barrier layer structures, which was has the sample type on the horizontal axis and the adhesive strength on the vertical axis.

In FIG. 15, the small black points represent the individual measured results, and large white points represent the average values of the measured results.

As shown in FIG. 15, in the case of the island formations, the adhesion was higher than that of the sample that had the layer formation formed thereon (e.g., comparative example), and thus the adhesiveness of the island formation samples were excellent.

According to the above described embodiment, it is possible to create a storage device having excellent data retention characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising:
a first electrode;
a second electrode;
a resistance change layer disposed between the first electrode and the second electrode; and
a plurality of islands that are disposed between the first electrode and a surface of the resistance change layer, the plurality of islands each comprising a metal movable inside the resistance change layer, wherein
the first electrode and the second electrode are formed of a material which is less likely to be ionized as compared to the metal, and
the first electrode is in contact with the surface of the resistance change layer at regions that are not covered by the plurality of islands.

2. The storage device of claim 1, wherein the metal comprises silver.

3. The storage device of claim 1, wherein the resistance change layer comprises silicon oxide.

4. The storage device of claim 1, wherein the first electrode comprises a material selected from the group consisting of titanium, titanium nitride, tantalum nitride and tungsten nitride.

5. The storage device of claim 1, wherein an amount of the metal that is disposed between the resistance change layer and the first electrode is 5 nm or less.

6. The storage device of claim 1, wherein
the first electrode includes a first wiring that extends in a first direction, and a conductive layer that is provided between the first wirings and the resistance change layer, and is in contact with the ion metal particles and the resistance change layer, and
the second electrode includes a second wiring that extends in a second direction that intersects with the first direction.

7. The storage device of claim 1, further comprising:
a current limiting layer that is formed of a material having electric resistivity higher than electric resistivity of the metal, and that is provided between the second electrode and the resistance change layer.

8. A storage device, comprising:
a first electrode;
a second electrode;
a resistance change layer disposed between the first electrode and the second electrode; and
a plurality of islands that are disposed between the first electrode and a surface of the resistance change layer, the plurality of islands each comprising a metal that will diffuse within the resistance change layer when an electrical bias is applied between the first electrode and the second electrode,
wherein the first electrode is in contact with the surface of the resistance change layer at regions that are not covered by the plurality of islands.

9. The storage device of claim 8, wherein the first electrodes and the second electrodes are formed from a material which is less likely to be ionized as compared to the metal.

10. The storage device of claim 8, wherein the metal comprises silver.

11. The storage device of claim 8, wherein the resistance change layer comprises silicon oxide.

12. The storage device of claim 8, wherein the first electrode comprises a material selected from the group consisting of titanium, titanium nitride, tantalum nitride and tungsten nitride.

13. The storage device of claim 8, wherein an amount of the metal, which is disposed between the resistance change layer and the first electrode, comprises an amount of material that would form a continuous layer having a thickness of 5 nm or less.

14. The storage device of claim 8, further comprising:
a current limiting layer that is formed of a material having an electric resistivity higher than an electric resistivity of the metal, and is provided between the second electrode and the resistance change layer.

15. A method of forming a storage device, comprising:
forming a first conductive layer on a surface of a substrate;
forming a resistance change layer over a surface of the formed first conductive layer;
forming a plurality of islands on a surface of the resistance change layer, the plurality of islands each comprising a metal; and
forming a second conductive layer on a surface of the formed resistance change layer and on a surface of the plurality of islands,
wherein the metal diffuses within the resistance change layer when an electrical bias is applied across a portion of the first conductive layer and the a portion of the second conductive layer.

16. The method of claim 15, wherein the first conductive layer and the second conductive layer are each formed from a material which is less likely to be ionized as compared to the metal.

17. The method of claim 15, wherein the metal comprises silver, and the resistance change layer comprises silicon oxide.

18. The method of claim 15, wherein the second conductive layer comprises a material selected from the group consisting of titanium, titanium nitride, tantalum nitride and tungsten nitride.

19. The method of claim 15, wherein an amount of the metal that is used to form the plurality of islands comprises a layer of 5 nm or less.

20. The method of claim 15, further comprising:
forming a current limiting layer between the first conductive layer and the resistance change layer, wherein an electric resistivity of the material used to form the current limiting layer is higher than electric resistivity of the metal.

* * * * *